United States Patent
Miura et al.

(10) Patent No.: US 9,588,193 B2
(45) Date of Patent: Mar. 7, 2017

(54) MAGNETIC SENSOR, MAGNETIC INSPECTION DEVICE, AND SHEET PROCESSING APPARATUS

(71) Applicant: Kabushiki Kaisha Toshiba, Tokyo (JP)

(72) Inventors: Junji Miura, Kanagawa (JP); Seiji Ikari, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 14/634,112

(22) Filed: Feb. 27, 2015

(65) Prior Publication Data
US 2015/0260805 A1    Sep. 17, 2015

(51) Int. Cl.
G06K 7/02 (2006.01)
G01R 33/12 (2006.01)
G01R 33/09 (2006.01)
G07D 7/04 (2016.01)

(52) U.S. Cl.
CPC ....... *G01R 33/1253* (2013.01); *G01R 33/096* (2013.01); *G07D 7/04* (2013.01)

(58) Field of Classification Search
USPC ....................................................... 235/449
See application file for complete search history.

(56) References Cited

U.S. PATENT DOCUMENTS

| 4,967,156 A | 10/1990 | Seitz |
| 5,616,911 A * | 4/1997 | Jagielinski ............. G06K 7/084 235/449 |
| 6,822,443 B1 | 11/2004 | Dogaru |
| 2003/0164700 A1 | 9/2003 | Goldfine et al. |
| 2008/0143328 A1 | 6/2008 | Thierauf et al. |

FOREIGN PATENT DOCUMENTS

| JP | 08-255276 A | 1/1996 |
| WO | 9838792 A1 | 9/1998 |

OTHER PUBLICATIONS

Extended European Search Report issued in the corresponding European Patent Application No. 15152252.1, mailed on Sep. 4, 2015 (13 pages).

* cited by examiner

*Primary Examiner* — Jamara Franklin
(74) *Attorney, Agent, or Firm* — Baker Botts L.L.P.

(57) ABSTRACT

According to one embodiment, a magnetic sensor includes: a case disposed facing an object that is to be detected; a plurality of magnetic sensing portions accommodated inside the case; and a magnetic generator disposed inside the case, between the plurality of magnetic sensing portions and the object that is to be detected.

17 Claims, 5 Drawing Sheets

MAGNETIC SENSOR, MAGNETIC INSPECTION DEVICE, AND SHEET PROCESSING APPARATUS

CROSS-REFERENCE TO RELATED APPLICATION

This application is based upon and claims the benefit of priority from Japanese Patent Application No. 2014-050581, filed on Mar. 13, 2014; the entire contents of which is incorporated herein by reference.

FIELD

Embodiments described herein relate generally to a magnetic sensor, a magnetic inspection device, and a sheet processing apparatus.

BACKGROUND

Conventionally, there are apparatuses that detect magnetic characteristic information of sheets that are being conveyed, using a magnetic sensor, thereby inspecting the authenticity, the type, and the like of the sheets. In such apparatuses, in the case of using a magnetic sensor including a plurality of magnetic sensing portions arranged in a direction orthogonal to the sheet conveying direction in order to perform precise detection throughout the entire area of a sheet, it is necessary to correct unevenness in sensitivity of the plurality of magnetic sensing portions. When correcting the unevenness in sensitivity, there is a demand for shortening the time required to adjust the sensitivity, by simultaneously adjusting the sensitivity of all of the plurality of magnetic sensing portions. Furthermore, there is a demand for improving the level of precision in adjusting the sensitivity, by stably generating a magnetic field that precisely resembles a change in magnetic field lines in the case where a sheet is actually detected.

DETAILED DESCRIPTION

According to one embodiment, there is provided a magnetic sensor including: a case disposed facing an object that is to be detected; a plurality of magnetic sensing portions accommodated inside the case; and a magnetic generator disposed inside the case, between the plurality of magnetic sensing portions and the object that is to be detected.

Hereinafter, a magnetic sensor, a magnetic inspection device, and a sheet processing apparatus of one embodiment will be described with reference to the drawings.

Figure 1:
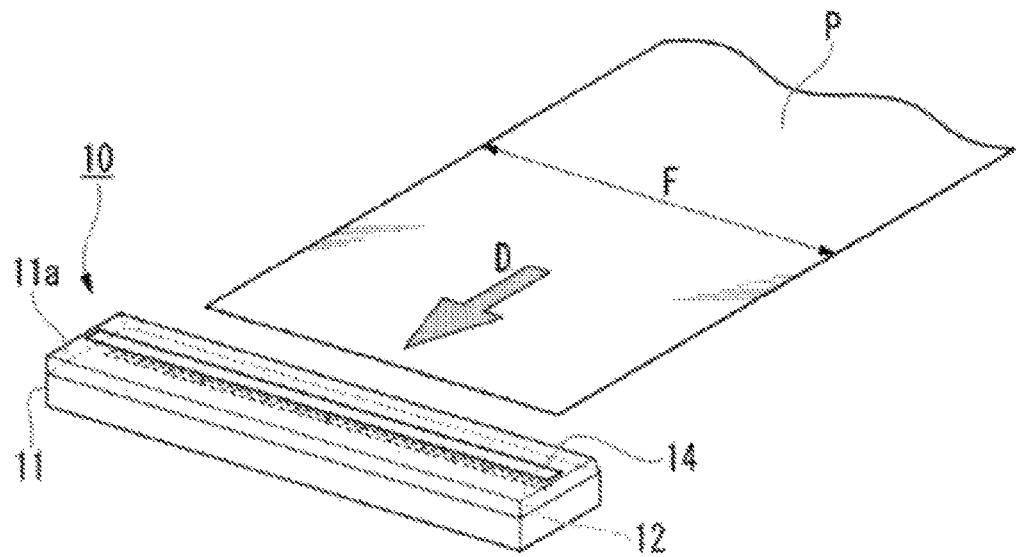
FIG. 1 is a perspective view showing the configuration of a magnetic sensor of one embodiment.
Figure 2:
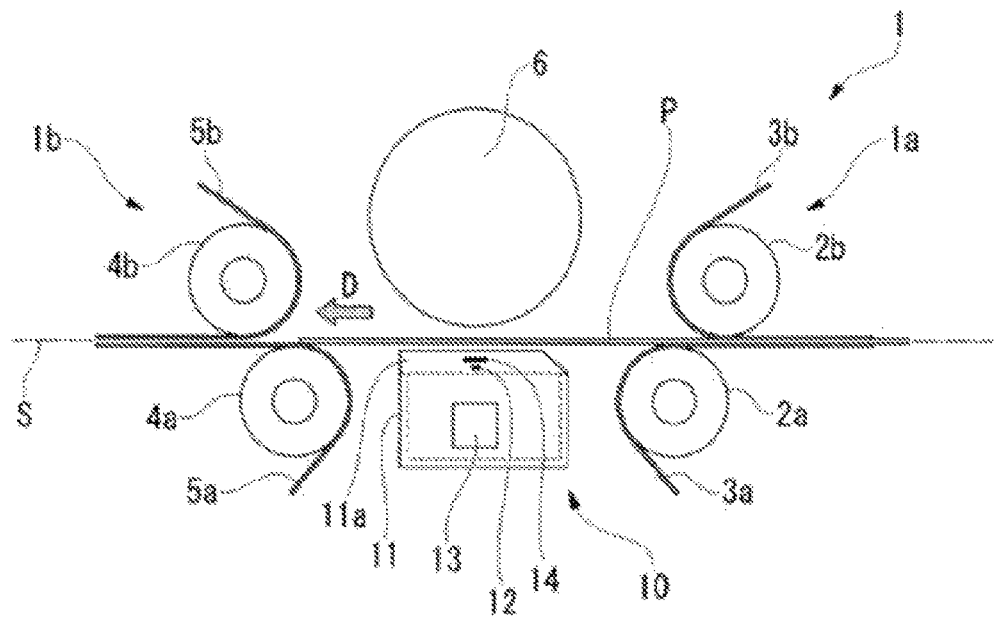
FIG. 2 is a cross-sectional view showing the configuration of the magnetic sensor of the embodiment.

A magnetic sensor 10 of this embodiment detects an object to be detected, such as a sheet having a magnetically printed portion. The magnetic printing is, for example, printing characters or images using magnetic ink. As shown in FIGS. 1 and 2, the magnetic sensor 10 of the embodiment detects a magnetic material in a magnetically printed portion included in a sheet P that is being conveyed by a conveying structure 1, and outputs a signal in accordance with magnetic characteristic information (e.g., magnetic print information, etc.) contained in the sheet P. The magnetic sensor 10 includes a sensor case 11, a plurality of magnetic sensing portions 12, a permanent magnet 13, a conductor 14, and a plurality of low noise amplifiers 15.

As shown in FIG. 2, the conveying structure 1 arranged near the magnetic sensor 10 includes an upstream side conveying structure 1a disposed on the upstream side of the magnetic sensor 10 in a conveying direction D and a downstream side conveying structure 1b disposed on the downstream side thereof. The upstream side conveying structure 1a and the downstream side conveying structure 1b are spaced away from each other by a distance shorter than the length of the sheet P in the conveying direction D.

The upstream side conveying structure 1a includes a pair of first and second conveying rollers 2a and 2b and a pair of first and second conveying belts 3a and 3b. The first and second conveying rollers 2a and 2b are arranged such that the rotational shafts thereof are parallel to each other and are off each other in the conveying direction D. Accordingly, the first conveying roller 2a is disposed close to the downstream side conveying structure 1b, and the second conveying roller 2b is disposed away from the downstream side conveying structure 1b. The first and second conveying belts 3a and 3b are respectively attached to the first and second conveying rollers 2a and 2b, and are curved back in a direction away from the downstream side conveying structure 1b. The first and second conveying belts 3a and 3b move between the first and second conveying rollers 2a and 2b while holding the sheet P from both sides in the thickness direction, thereby guiding the sheet P in the conveying direction D.

The downstream side conveying structure 1b includes a pair of third and fourth conveying rollers 4a and 4b and a pair of third and fourth conveying belts 5a and 5b. The third and fourth conveying rollers 4a and 4b are arranged such that the rotational shafts thereof are parallel to each other and are off each other in the conveying direction D. Accordingly, the third conveying roller 4a is disposed close to the upstream side conveying structure 1a, and the fourth conveying roller 4b is disposed away from the upstream side conveying structure 1a. The third and fourth conveying belts 5a and 5b are respectively attached to the third and fourth conveying rollers 4a and 4b, and are curved back in a direction away from the upstream side conveying structure 1a. The third and fourth conveying belts 5a and 5b move between the third and fourth conveying rollers 4a and 4b while holding the sheet P from both sides in the thickness direction, thereby guiding the sheet P in the conveying direction D.

The conveying structure 1 includes a conveying assist roller 6 facing the magnetic sensor 10 with a conveying reference surface S interposed therebetween. The conveying assist roller 6 is made of, for example, a non-magnetic material, and rotates at a peripheral speed equivalent to the belt conveying speed of the first to fourth conveying belts 3a, 3b, 5a, and 5b. Accordingly, the conveying assist roller 6 sends the sheet P discharged from the upstream side conveying structure 1a (i.e., the first and second conveying belts 3a and 3b), into the downstream side conveying structure 1b (i.e., the third and fourth conveying belts 5a and 5b), without stopping the sheet P. Furthermore, the sheet P that is being conveyed between the conveying assist roller 6 and the magnetic sensor 10 is constrained by the conveying assist roller 6 such that the distance between the magnetic sensor 10 and the sheet P, that is, the detection gap is within a certain distance.

The sensor case 11 is disposed facing the conveying reference surface S of the sheet P. The sensor case 11 is made of metal such as stainless steel. The sensor case 11 includes a cover 11a facing the sheet P that is moving along the conveying reference surface S. The cover 11a is made of insulating ceramic. In a width direction of the sheet P that is moving along the conveying reference surface S (i.e., a direction F orthogonal to the conveying direction D in a plane parallel to the conveying reference surface 5), the sensor case 11 is longer than the movement range of the sheet P. The sensor case 11 internally accommodates the plurality of magnetic sensing portions 12, the permanent magnet 13, the conductor 14, and the plurality of low noise amplifiers 15.

The plurality of magnetic sensing portions 12 are arranged in a line facing the sheet P that is to be detected. That is to say, the plurality of magnetic sensing portions 12 are arranged in a line sequentially adjacent to each other in the direction F orthogonal to the conveying direction D of the sheet P that is moving along the conveying reference surface S (i.e., the width direction of the sheet P). The magnetic sensing portions 12 include, for example, magnetic resistance elements (not shown) such as anisotropic magneto-resistance (AMR) elements configured by thin films made of ferromagnetic metal obtained by alloying nickel, iron, and the like.

A bias magnetic field generated by the permanent magnet 13 disposed on the rear face side of the magnetic resistance elements (i.e., the internal side of the sensor case 11 when viewed from the cover 11a) is always applied to each of the magnetic resistance elements. Each magnetic resistance element converts a change in bias magnetic field lines, caused by a magnetic material (i.e., magnetically printed portion on the sheet P, etc.) moving in the conveying direction D relative to (closer to or away from) the bias magnetic field generated by the permanent magnet 13, into a change in the resistance value, and outputs the change in the resistance value as an electrical signal. For example, the magnetic resistance element has a resistance value Ra corresponding to distribution of the bias magnetic field lines in a state where no magnetic material is present near the magnetic resistance element. When a magnetic material moves closer to the magnetic resistance element, the bias magnetic field lines of the bias magnetic field are deformed in accordance with the movement of the magnetic material, and the bias magnetic field acting on the magnetic resistance element changes. When the magnetic resistance element has a resistance value Rb corresponding to distribution of the bias magnetic field lines after this change, a difference between the resistance values (=Ra−Rb) is the change in the resistance value caused by the magnetic material moving closer to the magnetic resistance element.

Each of the magnetic sensing portions 12 includes a plurality of magnetic resistance elements, a circuit connecting the plurality of magnetic resistance elements, and the like (not shown). For example, each of the magnetic sensing portions 12 may include a bridge circuit bridge-connecting four of the magnetic resistance elements, wherein differential amplification is performed in which electrical signals output from the four magnetic resistance elements are processed one after another, while temperature compensation is performed so as to allow the temperature characteristics of the four magnetic resistance elements to cancel each other.

Figure 3:
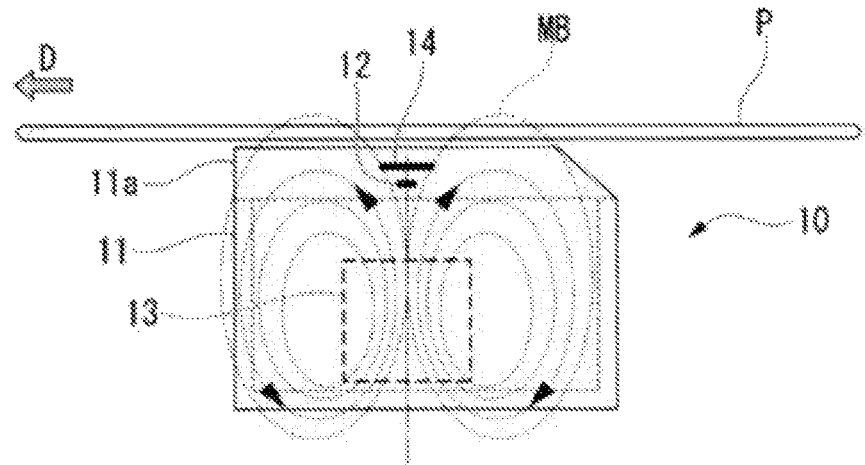
FIG. 3 is a cross-sectional view showing the configuration of the magnetic sensor of the embodiment, schematically showing a bias magnetic field generated by a permanent magnet.

The permanent magnet 13 is disposed on the rear face side of the plurality of magnetic sensing portions 12, that is, disposed closer to the internal side of the sensor case 11 than the plurality of magnetic sensing portions 12 are when viewed from the cover 11a. In the conveying direction D, the center position of the permanent magnet 13 is set so as to match the center positions of the plurality of magnetic sensing portions 12. The permanent magnet 13 is disposed so as to have a magnetization direction that is orthogonal to the conveying reference surface S. Accordingly, the permanent magnet 13 generates a bias magnetic field MB having a distribution of bias magnetic field lines as shown in FIG. 3.

The plurality of magnetic sensing portions 12 are arranged side by side in a direction orthogonal to the conveying direction D of the sheet P. The conductor 14 is a conductive member made of non-magnetic material, such as copper foil. The conductor 14 is disposed between the plurality of magnetic sensing portions 12 and the conveying reference surface S inside the sensor case 11. The conductor 14 is formed in the shape of a rectangular plate whose longitudinal direction is along the direction in which the plurality of magnetic sensing portions 12 are arranged in a line (i.e., the direction F orthogonal to the conveying direction D of the sheet P, that is, the width direction of the sheet P) and whose lateral direction is along the conveying direction D. The conductor 14 is shaped such that the length at least in the longitudinal direction of the conductor 14 is longer than the total length of the plurality of magnetic sensing portions 12 arranged in a line. In the conveying direction D, the center position of the conductor 14 is set so as to match the center position of the permanent magnet 13 and the center positions of the plurality of magnetic sensing portions 12.

Figure 4:
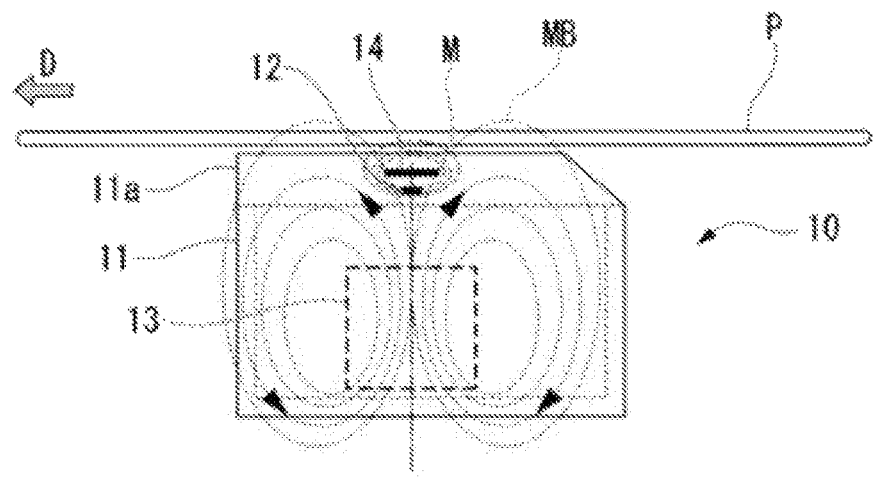
FIG. 4 is a cross-sectional view showing the configuration of the magnetic sensor of the embodiment, schematically showing the bias magnetic field generated by the permanent magnet and a magnetic field generated by a conductor.
Figure 5:
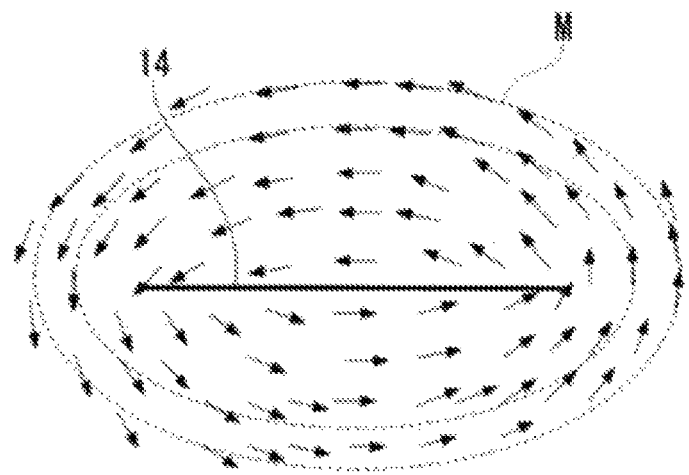
FIG. 5 is a view schematically showing the magnetic field generated by the conductor of the magnetic sensor of the embodiment.
Figure 6:
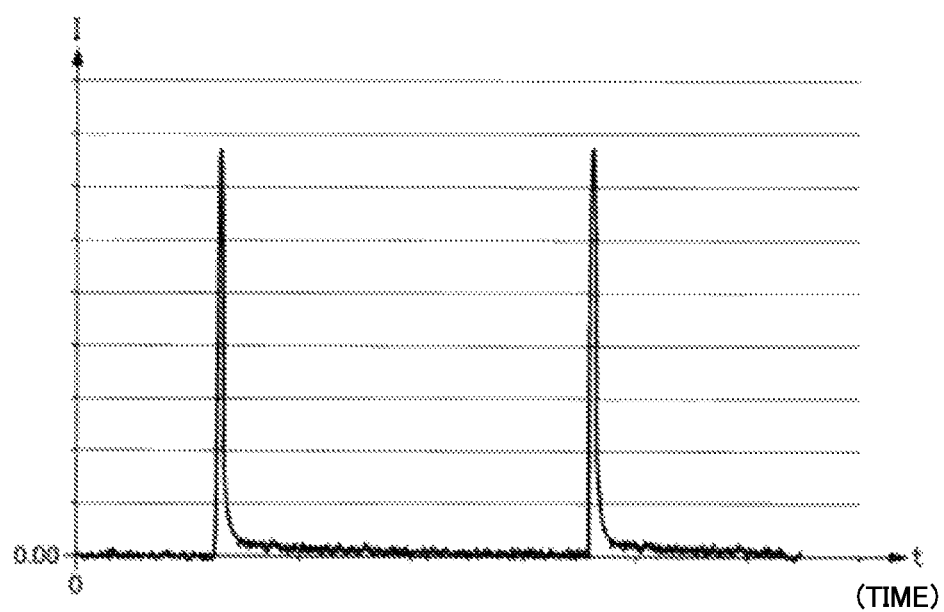
FIG. 6 is a graph showing an example of a pulse-like current supplied to the conductor of the magnetic sensor of the embodiment.

The conductor 14 has a first end in the longitudinal direction connected via a load resistance R to a magnetic field generator driver 21 described later, and a second end connected to the ground of the sensor case 11 or a circuit board (not shown). When a current is supplied from the magnetic field generator driver 21 described later, the conductor 14 generates a magnetic field M having a desired distribution of the magnetic field lines as shown in FIGS. 4 and 5 (i.e., a magnetic field right-handedly rotating with respect to the current flow direction). Note that the current supplied from the magnetic field generator driver 21 described later to the conductor 14 has, for example, a pulse-like current waveform as shown in FIG. 6. The shape of the conductor 14 (e.g., the width in the conveying direction D, the thickness in the direction orthogonal to the conveying reference surface S, etc.) and the arrangement position of the conductor 14 are set such that the magnetic field M having a desired distribution of the magnetic field lines is generated. That is to say, the conductor 14 is set such that, in a state where the bias magnetic field MB of the permanent magnet 13 is generated, a magnetic field that is the same as or resembles a magnetic field that acts on the plurality of magnetic sensing portions 12 when the sheet P is actually moving along the conveying reference surface S is generated in a state where no sheet P is present. For example, at least the magnetic flux direction of the magnetic field M shown in FIG. 4 is set so as to equally affect the plurality of magnetic sensing portions 12.

The plurality of low noise amplifiers 15 are respectively connected to the plurality of magnetic sensing portions 12. The low noise amplifiers 15 amplify and output the electrical signals (voltage signals) output from the respective magnetic sensing portions 12.

Figure 7:
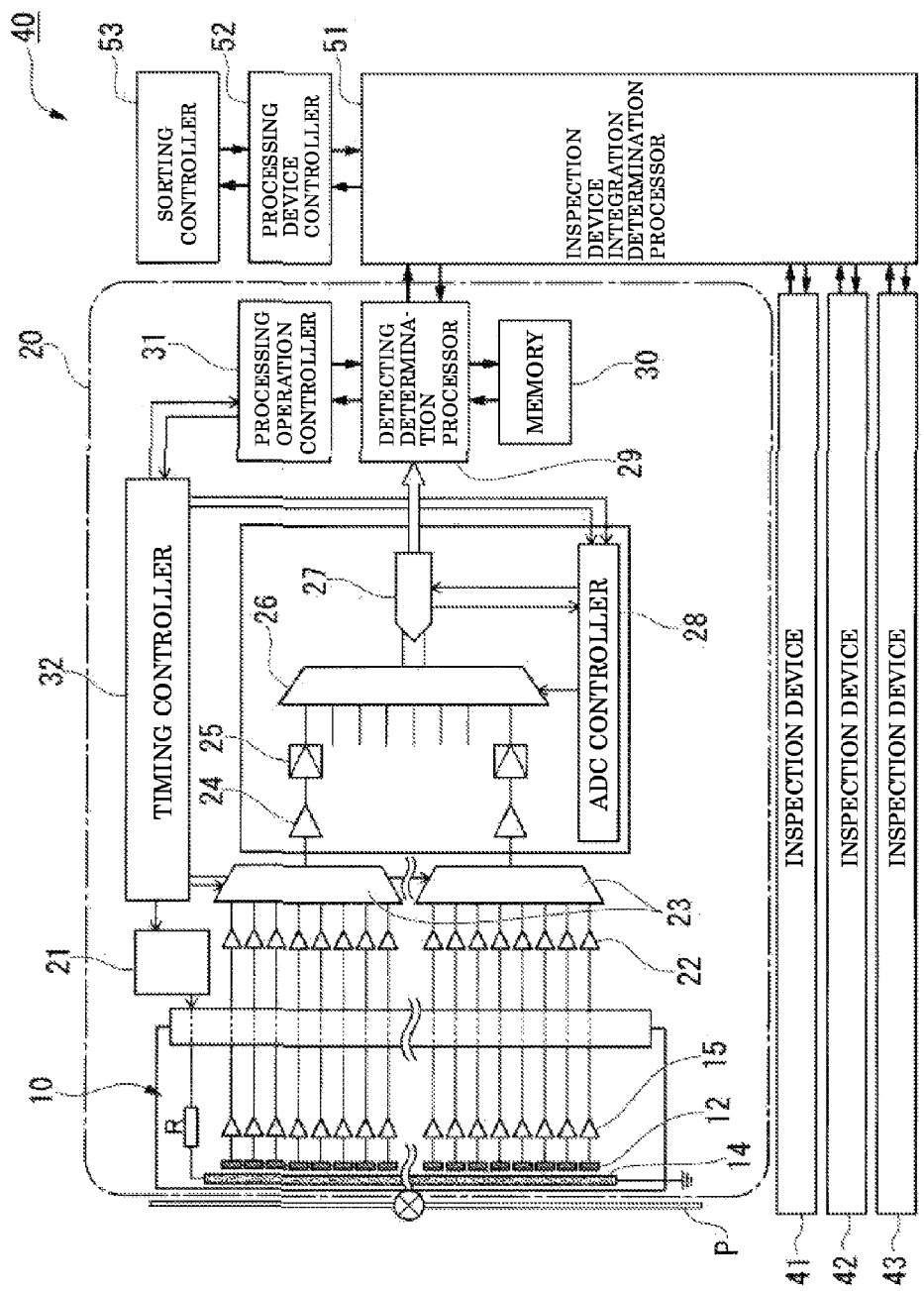
FIG. 7 is a block diagram showing the configuration of a magnetic inspection device and a sheet processing apparatus of the embodiment.

Hereinafter, a magnetic inspection device 20 including the magnetic sensor 10 of the embodiment described above will be described. As shown in FIG. 7, the magnetic inspection device 20 includes the magnetic sensor 10, the magnetic field generator driver 21, a plurality of preamplifiers 22, a plurality of pre-multiplexers 23, a plurality of amplifiers 24, a plurality of antialiasing filters (antialias filters) 25, a multiplexer 26, an analog-digital converter (ADC) 27, an ADC controller 28, a detecting determination processor 29, a memory 30, a processing operation controller 31, and a timing controller 32.

The magnetic field generator driver 21 supplies a current via the load resistance R to the conductor 14 of the magnetic sensor 10 in response to a command signal output from the timing controller 32 described later. The magnetic field generator driver 21 supplies a current, for example, having a pulse-like current waveform as shown in FIG. 6, to the conductor 14. The current waveform of a current that is to be supplied to the conductor 14 is set by the magnetic field generator driver 21 so as to have frequency characteristics higher than response characteristics of a circuit (not shown) that removes the influence given to the magnetic sensing portions 12 from environmental magnetism that changes in accordance with the position (region) or the time, such as terrestrial magnetism.

The plurality of preamplifiers 22 are respectively connected to the plurality of low noise amplifiers 15 of the magnetic sensor 10. The preamplifiers 22 amplify and output the electrical signals output from the respective low noise amplifiers 15. The plurality of pre-multiplexers 23 are respectively connected to the plurality of preamplifiers 22. The plurality of pre-multiplexers 23 divide in time series the electrical signals output from the plurality of preamplifiers 22, and output the obtained signals, in response to a command signal output from the timing controller 32 described later. That is to say, the pre-multiplexers 23 sequentially change in time series one electrical signal that is to be selected from among the electrical signals output from the plurality of preamplifiers 22, and sequentially output the selected one electrical signal.

The plurality of amplifiers 24 are respectively connected to the plurality of pre-multiplexers 23. The amplifiers 24 amplify and output the electrical signals output from the respective pre-multiplexers 23. The plurality of antialiasing filters 25 are respectively connected to the plurality of amplifiers 24. The antialiasing filters 25 perform anti-aliasing on the electrical signals output from the amplifiers 24, and output electrical signals in which folding noise has been reduced. The multiplexer 26 is connected to the plurality of antialiasing filters 25. The multiplexer 26 divides in time series the electrical signals output from the antialiasing filters 25, and outputs the obtained signals, in response to a command signal output from the timing controller 32 described later. The ADC 27 is connected to the multiplexer 26. The ADC 27 converts the analog electrical signals output from the multiplexer 26 into digital signals, and outputs the digital signals. The ADC controller 28 controls the operation of the ADC 27 in response to a command signal output from the timing controller 32 described later.

The detecting determination processor 29 operates in response to a command signal output from the processing operation controller 31 or an inspection device integration determination processor 51 described later. In a calibration mode, the detecting determination processor 29 sets correction coefficients for correcting unevenness in sensitivity of the plurality of magnetic sensing portions 12, using the electrical signals output from the ADC 27. In an authentication mode, the detecting determination processor 29 determines the authenticity, the type, and the like of the sheets P, while correcting unevenness in sensitivity of the plurality of magnetic sensing portions 12, using the electrical signals output from the ADC 27. In a self-diagnosis mode, the detecting determination processor 29 determines whether or not each of the plurality of magnetic sensing portions 12 is properly operating, using the electrical signals output from the ADC 27.

In order to set correction coefficients for correcting unevenness in sensitivity of the plurality of magnetic sensing portions 12, the detecting determination processor 29 outputs a signal to give an instruction to start the operation of the magnetic field generator driver 21, via the processing operation controller 31, to the timing controller 32 in a state where no sheet P is being conveyed. The detecting determination processor 29 acquires, as signals in an excited state, the electrical signals output from the ADC 27 in a state where a current is supplied from the magnetic field generator driver 21 to the conductor 14. Furthermore, the detecting determination processor 29 outputs a signal to give an instruction to stop the operation of the magnetic field generator driver 21, via the processing operation controller 31, to the timing controller 32 in a state where no sheet P is being conveyed. The detecting determination processor 29 acquires, as signals in an unexcited state, the electrical signals output from the ADC 27 in a state where the supply of a current from the magnetic field generator driver 21 to the conductor 14 has been stopped. The detecting determination processor 29 calculates differences between the signals in the excited state and the signals in the unexcited state respectively for the plurality of magnetic sensing portions 12, and obtains the differences as signal output components of the conductor 14. The detecting determination processor 29 calculates correction coefficients for causing the signal output component values to match a predetermined target value set in advance for the plurality of magnetic sensing portions 12, and stores the calculated correction coefficients in association with the respective magnetic sensing portions 12 in the memory 30.

In order to determine the authenticity, the type, and the like of the sheets P, the detecting determination processor 29 acquires, as input data, the electrical signals output from the ADC 27 for each of the sheets P that pass along the conveying reference surface S facing the magnetic sensor 10, in a state where the sheet P is being conveyed. At that time, the detecting determination processor 29 maintains the state in which the supply of a current from the magnetic field generator driver 21 to the conductor 14 has been stopped, and, thus, the non-magnetic conductor 14 gives no influence to the magnetic sensing operation of the magnetic sensor 10. The detecting determination processor 29 corrects the input data of each of the plurality of magnetic sensing portions 12 (e.g., multiplies the correction coefficient by the input data, etc.) using the correction coefficient stored in the memory 30, thereby calculating sheet magnetic data.

The detecting determination processor 29 performs integral arithmetic operation, partial arithmetic operation, pattern matching, or the like as the authenticity determination process of the sheet P, using the sheet magnetic data of each of the plurality of magnetic sensing portions 12. The detecting determination processor 29 performs the authenticity determination process of the sheet P, on the entire area of the sheet P or a selective partial area such as a portion where magnetic characteristics are concentrated. The detecting determination processor 29 determines whether or not the absolute magnitude of the magnetic characteristic information of the sheet P is within a predetermined range, as the integral arithmetic operation. The detecting determination processor 29 determines whether or not information of a characteristic line segment of the magnetic characteristic information of the sheet P is predetermined information, as the partial arithmetic operation. The detecting determination processor 29 compares a relationship between portions with and without the magnetic characteristic information of the sheet P, as the pattern matching. The detecting determination processor 29 acquires parameter data such as information of an area that is to be subjected to the authenticity determination process, arithmetic expressions, dictionary data for matching, and authenticity determination levels, from the memory 30. The detecting determination processor 29 sends the authenticity determination result of each of the sheets P that pass along the conveying reference surface S facing the magnetic sensor 10, to the inspection device integration determination processor 51 described later.

In order to perform self-diagnosis of the plurality of magnetic sensing portions 12, the detecting determination processor 29 outputs, at a suitable timing, a signal to give an instruction to start the operation of the magnetic field generator driver 21, via the processing operation controller 31, to the timing controller 32. As in the case of performing the authenticity determination process, the detecting determination processor 29 acquires the electrical signals output from the ADC 27, performs correction using the correction coefficient stored in the memory 30, and calculates the sheet magnetic data of each of the plurality of magnetic sensing portions 12. The detecting determination processor 29 determines whether or not the sheet magnetic data of each of the plurality of magnetic sensing portions 12 is within a proper range based on predetermined self-diagnosis levels stored in advance in the memory 30, thereby determining whether or not each of the plurality of magnetic sensing portions 12 is properly operating. The detecting determination processor 29 sends the self-diagnosis result, to the inspection device integration determination processor 51 described later.

The memory 30 stores the correction coefficients set by the detecting determination processor 29, that is, the correction coefficients for correcting unevenness in sensitivity of the plurality of magnetic sensing portions 12, in association with the respective magnetic sensing portions 12. The memory 30 stores the parameter data for use in the authenticity determination process that is to be performed by the detecting determination processor 29. The memory 30 stores the parameter data for use in the self-diagnosis that is to be performed by the detecting determination processor 29.

The processing operation controller 31 controls the operation of the detecting determination processor 29 using a command signal generated by the timing controller 32 described later. The timing controller 32 generates and outputs command signals to instruct operation timings of the magnetic field generator driver 21, the plurality of pre-multiplexers 23, the multiplexer 26, the ADC controller 28, and the like.

Hereinafter, a sheet processing apparatus 40 including the magnetic inspection device 20 of the embodiment described above will be described. The sheet processing apparatus 40 includes the magnetic inspection device 20, a plurality of inspection devices (e.g., three different inspection devices 41, 42, and 43, etc.) other than the magnetic inspection device 20, the inspection device integration determination processor 51, a processing device controller 52, and a sorting controller 53.

The inspection device integration determination processor 51 receives information of the sheets P that are to be processed, and command signals relating to the control of the operation of all inspection devices such as the calibration mode, the authentication mode, and the self-diagnosis mode, from the processing device controller 52 described later. The inspection device integration determination processor 51 controls the operation of the detecting determination processor 29 in response to a command signal acquired from the processing device controller 52. The inspection device integration determination processor 51 integrates determination results output from the magnetic inspection device 20 and the plurality of other inspection devices (e.g., the inspection devices 41, 42, and 43, etc.), and designates sorting destinations of the sheets P, such as discarding, re-circulating, or eliminating. The inspection device integration determination processor 51 receives self-diagnosis results output from the magnetic inspection device 20 and the plurality of other inspection devices, determines whether or not each of the inspection devices is properly operating, and outputs the determination results to the processing device controller 52.

The processing device controller 52 performs comprehensive control of operation modes, operator information, and the like of the sheet processing apparatus 40. The processing device controller 52 notifies the inspection device integration determination processor 51 of information of the sheets P that are to be processed, sorting conditions of the sheets P, and the like. The processing device controller 52 receives information indicating the sorting destinations designated by the inspection device integration determination processor 51, and notifies the sorting controller 53 of information indicating actual sorting destinations, thereby causing the sorting controller 53 to sort the sheets P. The processing device controller 52 determines whether or not other functions (e.g., structure controllers, software processors, connected devices, etc.) of the sheet processing apparatus 40 are properly operating, based on the determination results indicating whether or not the inspection devices are properly operating, output from the inspection device integration determination processor 51. The processing device controller 52 notifies the operator whether or not the processing can be continued, according to the determination results indicating whether or not the sheet processing apparatus 40 is properly operating.

According to the embodiment described above, the conductor 14 is disposed between the plurality of magnetic sensing portions 12 and the conveying reference surface S inside the sensor case 11, and, thus, a magnetic field that precisely resembles a change in magnetic field lines in the case where the sheet P is actually detected can be stably generated. Furthermore, the distance between the plurality of magnetic sensing portions 12 and the conductor 14 inside the magnetic sensor 10 can be precisely set, and a magnetic field distribution in a necessary minimum range, precisely resembling a change in the magnetic field caused by the actual sheet P can be easily generated in a narrow area near the magnetic sensing portions 12. Furthermore, since the range is narrow, a desired magnetic field distribution can be generated inside the magnetic sensor 10 without being magnetically affected by structures near the magnetic sensor 10, and there is no need to restrict the arrangement and materials of the structures near the magnetic sensor 10. Furthermore, since one conductor 14 is provided for the plurality of magnetic sensing portions 12, the magnetic field M in which magnetic field lines are distributed equally with respect to the magnetic sensing portions 12 can be generated, and the sensitivities of the plurality of magnetic sensing portions 12 can be simultaneously adjusted. Accordingly, correction coefficients for correcting unevenness in sensitivity of the plurality of magnetic sensing portions 12 can be precisely set in a short time. Moreover, for example, a magnetically printed object for the sensitivity adjustment, which may cause problems due to unevenness in the magnetic print density and management of the distance from the magnetic sensor 10 when the object is being conveyed, is not necessary. Furthermore, whether or not each of the plurality of magnetic sensing portions 12 is properly operating can be immediately self-diagnosed at a suitable timing, without requiring the actual sheet P.

Furthermore, since the conductor 14 disposed inside the magnetic sensor 10 is non-magnetic, no influence is given to the magnetic sensing operation of the magnetic sensor 10 when the supply of a current to the conductor 14 has been stopped, and magnetic characteristic information of the sheet P can be precisely detected. Furthermore, since the conductor 14 disposed is made of copper foil, the magnetic sensor 10 can be easily formed while suppressing an increase in the cost required for forming the magnetic sensor 10.

Furthermore, since the magnetic field generator driver 21 supplies a current having a pulse-like current waveform to the conductor 14, even in the case where a circuit that removes the influence given to the magnetic sensing portions 12 from environmental magnetism such as terrestrial magnetism is provided, a change in the magnetic field caused by the magnetic field M generated by the conductor 14 can be detected as appropriate.

Furthermore, since the sensor case 11 includes the insulating cover 11a, even in the case where the cover 11a does not function as a discharge route for a ground-fault current when grounded discharge of static electricity occurs, the static electricity can be discharged via the conductor 14, and, thus, the magnetic sensing portions 12 can be protected.

Figure 8:
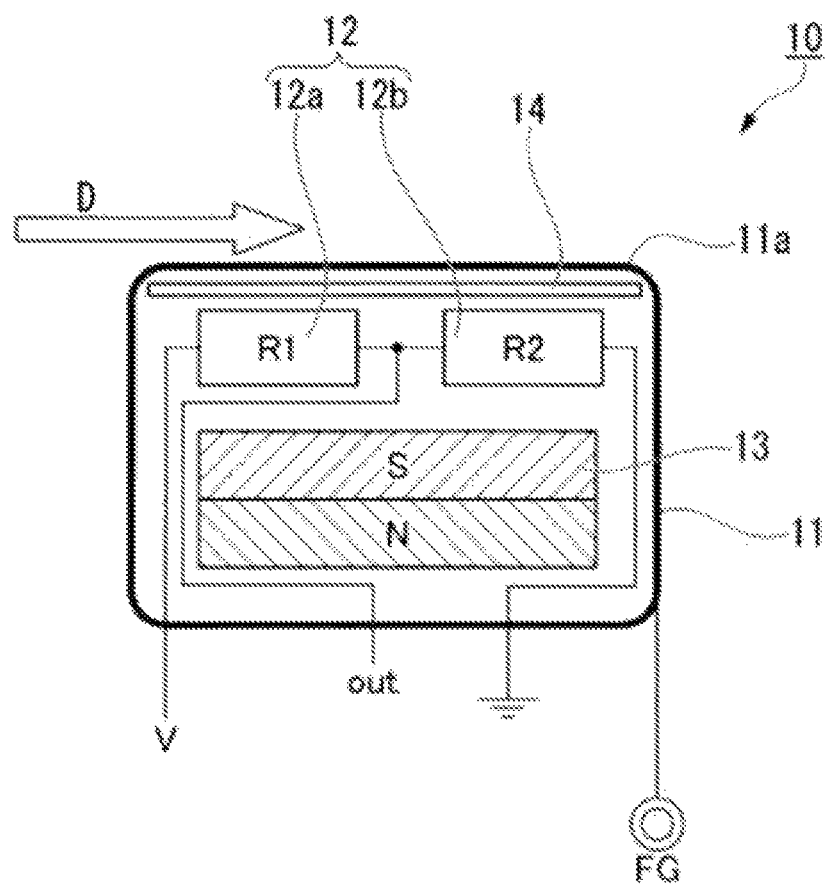
FIG. 8 is a diagram schematically showing the configuration of the magnetic sensor according to a modification of the embodiment.

Hereinafter, modifications will be described. In the foregoing embodiment, the magnetic sensing portions 12 include, as the magnetic resistance elements, anisotropic magneto-resistance (AMR) elements configured by thin films made of anisotropic and ferromagnetic material, but there is no limitation to this. The magnetic sensor 10 according to a modification of the foregoing embodiment may include, as the magnetic resistance elements, magneto-resistance (MR) elements configured by thin films made of semiconductor such as single crystal of indium antimonide (InSb), as shown in FIG. 8. Each magnetic sensing portion 12 of this modification includes two magnetic resistance elements R1 and R2 that are arranged parallel to the conveying direction D of the sheet P. When bias magnetic field lines of the permanent magnet 13 are changed by a magnetic material (i.e., magnetically printed portion on the sheet P, etc.) moving in the conveying direction D, the magnetic sensing portion 12 outputs a difference between the resistance values of the two magnetic resistance elements R1 and R2 in accordance with the change in bias magnetic field lines, as an electrical signal.

In the foregoing embodiment, the center position of the conductor 14, the center position of the permanent magnet 13, and the center positions of the plurality of magnetic sensing portions 12 are set so as to match each other in the conveying direction D, but there is no limitation to this. The center positions may be off each other.

In the foregoing embodiment, in order to calculate correction coefficients, the detecting determination processor 29 acquires signals in an unexcited state, but there is no limitation to this. The detecting determination processor 29 may calculate correction coefficients using only signals in an excited state. Alto, the detecting determination processor 29 may select whether or not to calculate correction coefficients using signals in an unexcited state, according to magnetic environment conditions and temperature environment conditions in the vicinity of the magnetic sensor 10.

In the foregoing embodiment, the detecting determination processor 29 corrects digitalized data (i.e., input data of each of the plurality of magnetic sensing portions 12 output from the ADC 27) using the correction coefficient stored in the memory 30, but there is no limitation to this. For example, the magnetic inspection device 20 may include, as the plurality of amplifiers 24, programmable gain amplifiers (PGAs) that perform analog gain adjustment instead of fixed-gain amplifiers that have a constant amplification factor, and unevenness in sensitivity of the plurality of magnetic sensing portions 12 may be corrected by hardware.

In the foregoing embodiment, the magnetic field generator driver 21 supplies a current having a pulse-like current waveform to the conductor 14, but there is no limitation to this. For example, if the magnetic sensing portions 12 are not affected by fluctuation in the environmental magnetic field near the magnetic sensor 10, the magnetic field generator driver 21 may supply a constant current to the conductor 14.

In the foregoing embodiment, the object that is to be detected by the magnetic sensor 10 is a sheet having a magnetically printed portion, but there is no limitation to this. For example, airline tickets, objects having magnetic bar code, and the like also may be detected. For other various objects that are to be detected, the magnetic sensor 10 can stably generate a magnetic field that precisely resembles a change in magnetic field lines in the case where such objects are actually detected.

According to at least one embodiment described above, the conductor 14 is disposed inside the sensor case 11, between the plurality of magnetic sensing portions 12 and the object that is to be detected, and, thus, a magnetic field that precisely resembles a change in magnetic field lines in the case where such an object is actually detected can be stably generated. Furthermore, the distance between the plurality of magnetic sensing portions 12 and the conductor 14 inside the magnetic sensor 10 can be precisely set. Thus, a magnetic field distribution in a necessary minimum range, precisely resembling a change in the magnetic field caused by the actual object that is to be detected can be easily generated in a narrow area near the magnetic sensing portions 12. Furthermore, a desired magnetic field distribution can be generated inside the magnetic sensor 10 without being magnetically affected by structures near the magnetic sensor 10, and there is no need to restrict the arrangement and materials of the structures near the magnetic sensor 10. Furthermore, since one conductor 14 is provided for the plurality of magnetic sensing portions 12, the magnetic field M in which magnetic field lines are distributed equally with respect to the magnetic sensing portions 12 can be generated, and the sensitivities of the plurality of magnetic sensing portions 12 can be simultaneously adjusted in a short time. Furthermore, whether or not each of the plurality of magnetic sensing portions 12 is properly operating can be immediately self-diagnosed at a suitable timing, without requiring the actual object that is to be detected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic sensor comprising:
   a case disposed facing an object that is to be detected;
   a plurality of magnetic sensing portions accommodated inside the case; and
   a magnetic generator disposed inside the case, between the plurality of magnetic sensing portions and the object that is to be detected, the magnetic generator being a non-magnetic conductive member.

2. The sensor according to claim 1, wherein the plurality of magnetic sensing portions are arranged facing the object that is to be detected.

3. The sensor according to claim 1, wherein the plurality of magnetic sensing portions are arranged in a line sequentially adjacent to each other in a direction orthogonal to a conveying direction of the object that is to be detected.

4. The sensor according to claim 3, wherein the conductive member is disposed along a direction in which the magnetic sensing portions are arranged in a line.

5. The sensor according to claim 4, wherein the conductive member is made of copper foil.

6. The sensor according to claim 1, wherein the magnetic generator generates a magnetic field that is the same as or resembles a magnetic field that acts on the plurality of magnetic sensing portions due to the object that is to be detected, in a state where the object that is to be detected is not present.

7. The sensor according to claim 1, wherein a magnet configured to generate a bias magnetic field is accommodated inside the case, and each of the plurality of magnetic sensing portions includes a magnetic resistance element.

8. A magnetic inspection device comprising:
   a magnetic sensor having a case disposed facing an object that is to be detected, a plurality of magnetic sensing portions accommodated inside the case, and a magnetic generator disposed inside the case, between the plurality of magnetic sensing portions and the object that is to be detected;
   an inspection unit configured to inspect the object that is to be detected, using signals output from the plurality of magnetic sensing portions;
   a current supply unit configured to supply a current to the magnetic generator, thereby causing the magnetic generator to generate a magnetic field; and
   a correcting unit configured to cause a value of each signal output by the plurality of magnetic sensing portions to match a predetermined target value, according to the magnetic field generated by the magnetic generator.

9. The device according to claim 8, wherein the plurality of magnetic sensing portions are arranged in a line sequentially adjacent to each other in a direction orthogonal to a conveying direction of the object that is to be detected.

10. The device according to claim 9, wherein the magnetic generator is a non-magnetic conductive member, and the conductive member is disposed along a direction in which the magnetic sensing portions are arranged in a line.

11. The device according to claim 8, wherein the current supply unit supplies a pulse-like current to the magnetic generator.

12. The device according to claim 8 further comprising: a diagnosis unit configured to cause the current supply unit to supply a current to the magnetic generator at a suitable timing, and diagnose the plurality of magnetic sensing portions using signals output from the plurality of magnetic sensing portions.

13. A sheet processing apparatus comprising:
   a conveying unit configured to convey a sheet;
   a magnetic inspection device including:
     a magnetic sensor having a case disposed facing a conveying reference surface of a sheet that is being conveyed, a plurality of magnetic sensing portions accommodated inside the case, and a magnetic generator disposed inside the case, between the plurality of magnetic sensing portions and the sheet;
     an inspection unit configured to inspect the sheet using signals output from the plurality of magnetic sensing portions;
     a current supply unit configured to supply a current to the magnetic generator, thereby causing the magnetic generator to generate a magnetic field; and
     a correcting unit configured to cause a value of each signal output by the plurality of magnetic sensing portions to match a predetermined target value, according to the magnetic field generated by the magnetic generator; and
   a sorting processor configured to sort the sheet that is being conveyed by the conveying unit, according to an inspection result of the sheet obtained at least by the magnetic inspection device.

14. The device according to claim 13, wherein the plurality of magnetic sensing portions of the magnetic sensor are arranged in a line sequentially adjacent to each other in a direction orthogonal to a conveying direction of the sheet.

15. The device according to claim 13, wherein the magnetic generator of the magnetic sensor is a non-magnetic conductive member, and the conductive member is disposed along a direction in which the magnetic sensing portions are arranged in a line.

16. The device according to claim 13, wherein the current supply unit of the magnetic inspection device supplies a pulse-like current to the magnetic generator.

17. The device according to claim 13 further comprising: a diagnosis unit configured to cause the current supply unit to supply a current to the magnetic generator at a suitable timing, and diagnose the plurality of magnetic sensing portions using signals output from the plurality of magnetic sensing portions.

* * * * *